United States Patent
Campbell et al.

(10) Patent No.: US 10,535,617 B2
(45) Date of Patent: Jan. 14, 2020

(54) IMPLEMENTING TRANSIENT ELECTRONIC CIRCUITS FOR SECURITY APPLICATIONS

(71) Applicant: International Business Machines Corporation, Armonk, NY (US)

(72) Inventors: Eric J. Campbell, Rochester, MN (US); Sarah Czaplewski-Campbell, Adams, MN (US); Timothy Tofil, Rochester, MN (US); Joseph Kuczynski, North Port, FL (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/975,955

(22) Filed: May 10, 2018

(65) Prior Publication Data

US 2019/0348378 A1    Nov. 14, 2019

(51) Int. Cl.
| | | |
|---|---|---|
| H01L 23/02 | (2006.01) | |
| H01L 23/00 | (2006.01) | |
| H05K 1/02 | (2006.01) | |
| B82Y 30/00 | (2011.01) | |

(52) U.S. Cl.
CPC ............ *H01L 23/573* (2013.01); *B82Y 30/00* (2013.01); *H01L 24/29* (2013.01); *H01L 24/48* (2013.01); *H05K 1/0275* (2013.01); *H01L 2224/29339* (2013.01); *H01L 2924/01047* (2013.01); *H01L 2924/10253* (2013.01); *H01L 2924/14* (2013.01)

(58) Field of Classification Search
CPC ..... H01L 23/57; H01L 23/573; H05K 1/0275; B82Y 30/00

USPC .......................... 257/922, 687, 679
See application file for complete search history.

(56) References Cited

U.S. PATENT DOCUMENTS

| | | | |
|---|---|---|---|
| 5,880,523 A | 3/1999 | Candelore | |
| 6,956,283 B1 * | 10/2005 | Peterson | B81B 7/0025 257/680 |
| 7,494,608 B2 * | 2/2009 | Li | B22F 1/0018 252/514 |
| 7,830,021 B1 | 11/2010 | Wilcoxon et al. | |

(Continued)

FOREIGN PATENT DOCUMENTS

| | | |
|---|---|---|
| JP | 2001313462 A | 11/2001 |
| JP | 2012074451 A | 4/2012 |

OTHER PUBLICATIONS

Composites Formed from Thermoresponsive Polymers and Conductive Nanowires for Transient Electronic Systems; DOI:10.1021/ascmi.7b04748.

(Continued)

*Primary Examiner* — Hung K Vu
(74) *Attorney, Agent, or Firm* — Joan Pennington

(57) ABSTRACT

A method and circuit for implementing transient electronic circuits for security applications, and a design structure on which the subject circuit resides are provided. Silver nanowire traces are fabricated forming a protection circuit in a soluble material. A frangible material is provided separating the soluble material from a solvent layer proximately located. During a tampering event the frangible material is ruptured releasing the solvent which contacts and dissolves the soluble material and disperses the silver nanowire traces creating an electrical open in the protection circuit. The electrical open enables enhanced tampering detection.

7 Claims, 8 Drawing Sheets

(56) References Cited

U.S. PATENT DOCUMENTS

| | | |
|---|---|---|
| 8,288,857 B2 | 10/2012 | Das et al. |
| 8,797,059 B2 | 8/2014 | Boday et al. |
| 9,245,202 B2* | 1/2016 | Boday ................ G01N 21/6447 |
| 2003/0015422 A1* | 1/2003 | Fritsch ................... B82Y 30/00 |
| | | 204/403.01 |
| 2009/0109035 A1* | 4/2009 | Subramanian ....... G08B 13/242 |
| | | 340/572.8 |
| 2010/0123582 A1* | 5/2010 | Smith ................ G08B 13/2414 |
| | | 340/572.3 |
| 2016/0219694 A1 | 7/2016 | Monson et al. |

OTHER PUBLICATIONS

"Water Soluble Polymers" http://snf.som.au/downloads/water_soluble_polymers_e.pdf.

* cited by examiner

400

406

410

IMPLEMENTING TRANSIENT ELECTRONIC CIRCUITS FOR SECURITY APPLICATIONS

FIELD OF THE INVENTION

The present invention relates generally to the data processing field, and more particularly, relates to a method and circuit for implementing transient electronic circuits for security applications, and a design structure on which the subject circuit resides.

DESCRIPTION OF THE RELATED ART

Current security devices, such as fabricated by International Business Machines Corporation, are implemented to protect against data theft in both high end and personal computing systems. These devices utilize special high priced security features that drive up production cost and present many processing challenges during manufacturing.

It is important though to recognize that each device must meet the U.S. Government Federal Information Processing Standards (FIPS), which are used as means to determine the protection offered from proposed and currently used security devices. Some security devices must meet high level requirements for security protection such as contained in the U.S. Government Federal Information Processing Standard (FIPS) 140-2 Security Requirements for Cryptographic Modules-(Level 4). The standard states that: "At this security level, the physical security mechanisms provide a complete envelope of protection around the cryptographic module with the intent of detecting and responding to all unauthorized attempts at physical access" (FIPS Pub 140-2).

Methods have been devised to indicate tampering of the electronic circuitry within an enclosure. However, the known methods typically involve shorting between existing circuit traces.

A need exists for efficient and effective transient electronic circuits for security applications including a protection circuit for use with a cryptographic module.

SUMMARY OF THE INVENTION

Principal aspects of the present invention are to provide a method for implementing a transient electronic circuit for security applications, and a design structure on which the subject circuit resides. Other important aspects of the present invention are to provide such method, circuit and design structure substantially without negative effects and that overcome many of the disadvantages of prior art arrangements.

In brief, a method for implementing a transient electronic circuit for security applications, and a design structure on which the subject circuit resides are provided. Silver nanowire traces are fabricated forming a protection circuit in a soluble material. A frangible material is provided separating the soluble material from a solvent layer proximately located. During a tampering event the frangible material is ruptured releasing the solvent which contacts and dissolves the soluble material and disperses the silver nanowire traces creating an electrical open in the protection circuit. The electrical open enables enhanced tampering detection.

In accordance with features of the invention, the frangible material is a selected material being easily breakable by attempts at physical access.

In accordance with features of the invention, the soluble material can be implemented with various non-conductive soluble polymers. The soluble material includes a non-conductive water soluble material, such as, a water soluble polymer.

In accordance with features of the invention, detecting tampering provides enhanced detecting of unauthorized attempts at physical access.

In accordance with features of the invention, silver nanowires (AgNW) are dispersed based upon dissolving the soluble material providing enhanced tamper detection.

In accordance with features of the invention, a silver nanowires (AgNW) layer is carried by a security surface.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
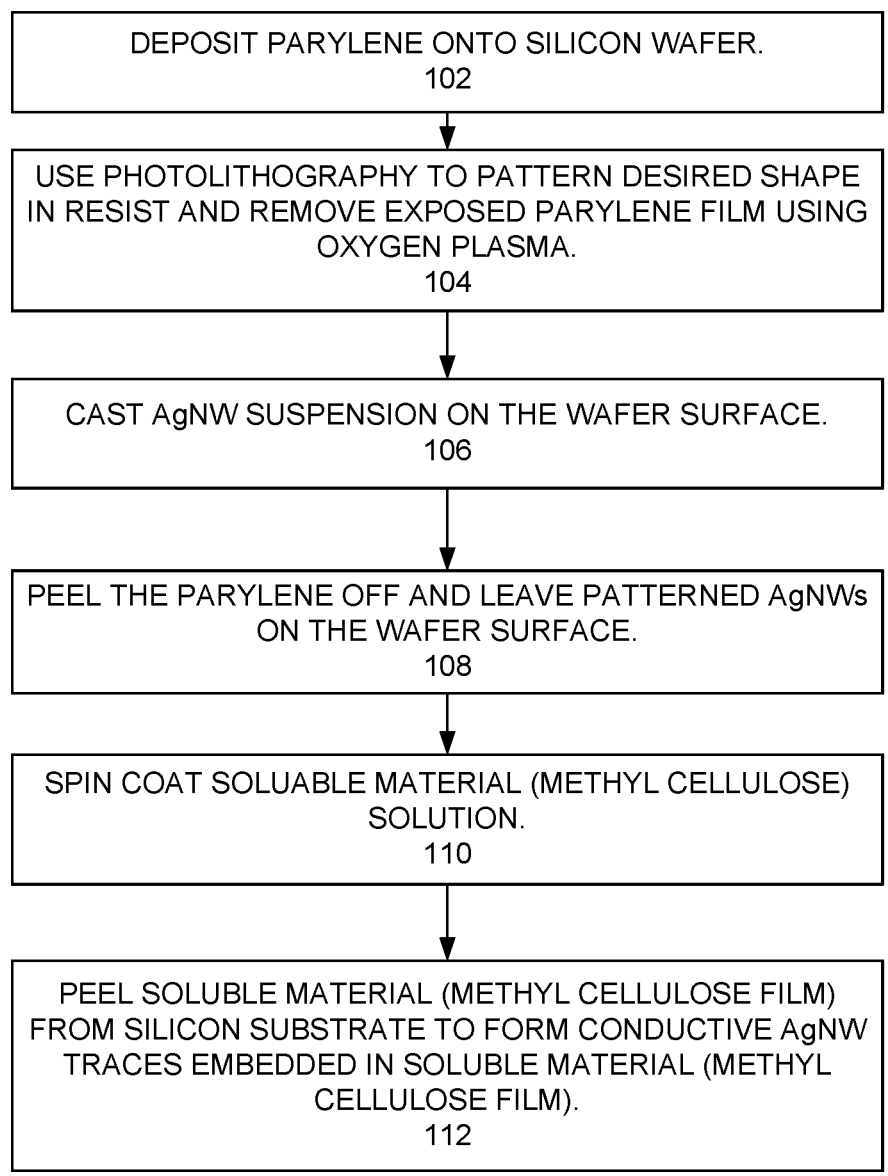
FIG. 1 is a flow chart illustrating exemplary steps for manufacturing a silver nanowires (AgNW) layer for use for a transient electronic circuit for security applications in accordance with a preferred embodiment.

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method for implementing a transient electronic circuit for security applications with a silver nanowires (AgNW) layer, and a design structure on which the subject circuit resides are provided. Example Preparation of a Silver Nanowires (AgNW) Layer Having reference now to the drawings, in FIG. 1, there is shown a flow chart illustrating example steps generally designated by reference character 100 for manufacturing a silver nanowires (AgNW) layer for use for a transient electronic circuit for security applications in accordance with a preferred embodiment. As indicated at a block 102, a parylene film or parylene conformal coating is deposited on a silicon (Si) substrate or Si wafer in the example processing steps. As indicated at a block 104, photolithography is used to pattern a desired shape in a photoresist deposited on the parylene film and exposed parylene film is removed using oxygen plasma. As indicated at a block 106, a silver nanowires (AgNW) suspension is cast on the silicon wafer surface. The parylene film is peeled off and the patterned AgNW is left on the wafer surface, as indicated at a block 108. As indicated at a block 110, spin coating a soluble material, such as methyl cellulose solution on the AgNW and the wafer surface is provided. As indicated at a block 112, the soluble material, such as methyl cellulose film is peeled from the silicon substrate to form conductive AgNW traces embedded in the soluble material, such as the methyl cellulose film.

It should be understood that various other processes could be used to form conductive AgNW traces embedded in the soluble material, while the illustrated steps of FIG. 1 provide an example process. It should be understood that the present invention is not limited to the illustrated process.

Figure 2:
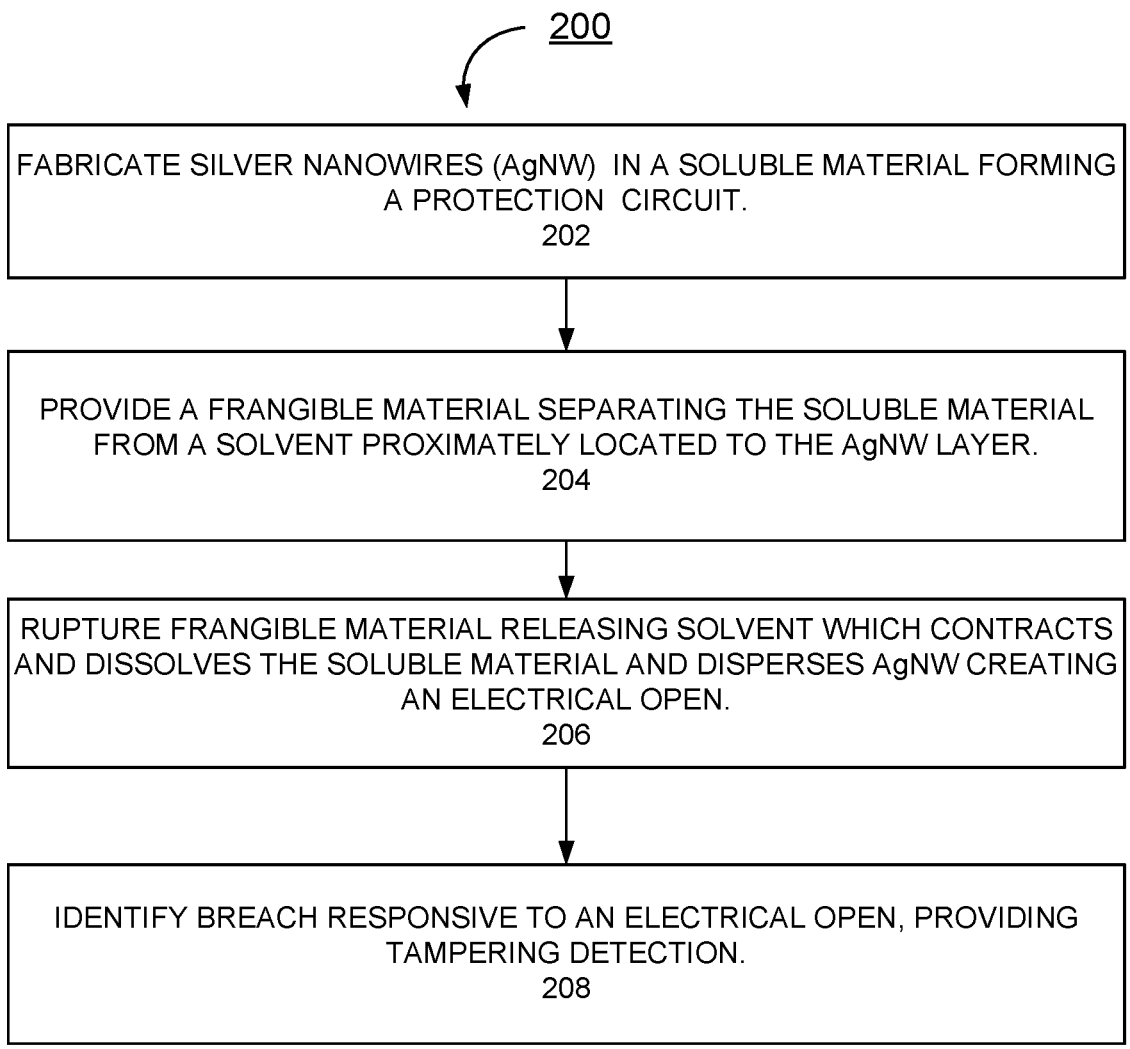
FIG. 2 is a flow chart illustrating example steps for implementing a transient electronic circuit for security applications with the silver nanowires (AgNW) layer of FIG. 1 in accordance with a preferred embodiment.

Referring to FIG. 2, there are shown example steps generally designated by reference character 200 for implementing a transient electronic circuit for security applications with the silver nanowires (AgNW) layer of FIG. 1 in accordance with a preferred embodiment. As indicated at a block 202, silver nanowire traces are fabricated in a soluble material forming a protection circuit. As indicated at a block 204, a frangible material is provided separating the soluble material from a solvent proximately located to the AgNW layer. As indicated at a block 206, during a tampering event the frangible material is ruptured releasing the solvent which contacts and dissolves the soluble material and disperses the silver nanowire traces creating an electrical open in the protection circuit. For example, when subjected to temperatures below a lower critical solution temperature (LCST) in the presence of water, methyl cellulose dissolves and the silver nanowires (AgNWs) disperse into solution resulting in a dramatic drop in conductance, such as greater than 3 orders of magnitude. Incorporation of the AgNWs into a protection card that consists of a frangible layer that contains water, either microencapsulated water or some other delivery vehicle, enables an effective tamper detection device. As indicated at a block 208, a breach is identified responsive to an electrical open, enables enhanced tampering detection.

Figure 3:
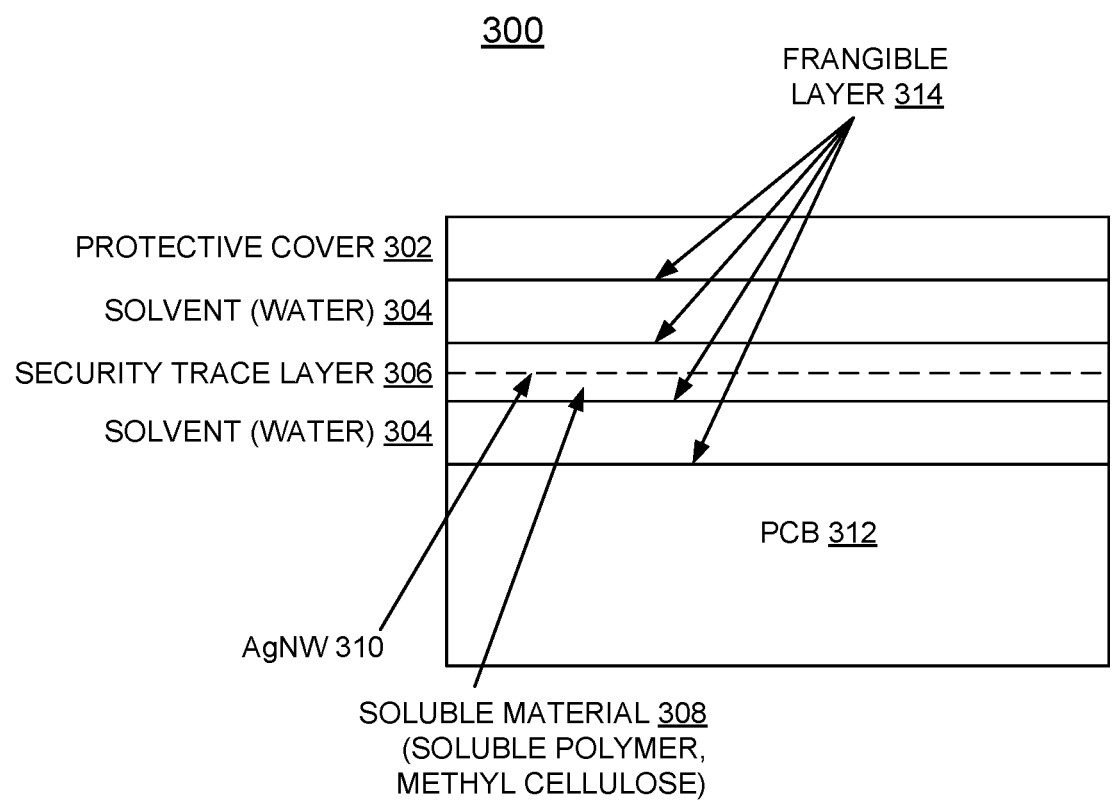
FIG. 3 schematically illustrates an example structure of FIGS. 1 and 2 implementing a transient electronic circuit for security applications in accordance with a preferred embodiment.

Referring now to FIG. 3, there is schematically shown an example structure generally designated by reference character 300 of FIGS. 1 and 2 implementing a transient electronic circuit for security applications in accordance with a preferred embodiment. The example tampering detection structure 300 includes a protective cover 302, a first solvent layer 304 above a security trace layer 306, and a second solvent layer 304 below the security trace layer 306. Security trace layer 306 includes a soluble, non-conductive material, such as methyl cellulose, a water soluble polymer, with AgNW traces 310 indicated by dashed lines incorporated into the soluble, non-conductive material. As shown, tampering detection structure 300 includes a printed circuit board (PCB) 312 and a plurality of frangible layers 314 containing the first and second solvent layers 304. During a tamper event, the frangible layer 314 is ruptured releasing solvent, such as water which dissolves the soluble medium 304 and AgNW traces 310, creating an electrical open. The open is detected by appropriate sensing circuitry and the necessary action to prevent data theft ensues.

FIGS. 4A, 4B, 4C, 4D, 4E, 4F, and 4G schematically illustrates example processing steps to implement silver nanowires (AgNW) layer for use for a transient electronic circuit for security applications in accordance with a preferred embodiment.

Figure 4A:
FIGS. 4A, 4B, 4C, 4D, 4E, 4F, and 4G schematically illustrates example processing steps to implement silver nanowires (AgNW) layer for use for a transient electronic circuit for security applications in accordance with a preferred embodiment.

Referring to FIG. 4A, as shown in at 400, a parylene film or parylene conformal coating 404 is deposited on a silicon (Si) substrate or Si wafer 402 in the example processing steps.

Figure 4B:
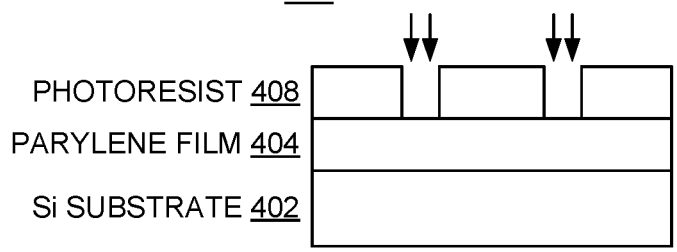

Referring to FIG. 4B, as shown at 406, photolithography is used to pattern a desired shape in a photoresist 408 deposited on the parylene film 404 and exposed parylene film is removed using oxygen plasma indicated by multiple arrows.

Figure 4C:

Referring to FIG. 4C, as shown at 410, the photoresist 408 has been removed.

Figure 4D:
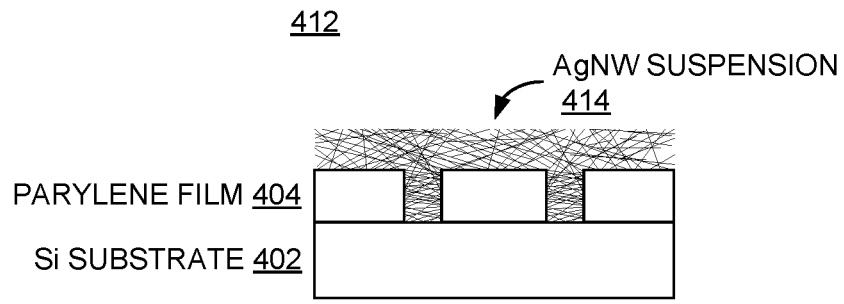

Referring to FIG. 4D, as shown at 412, a silver nanowires (AgNW) suspension 414 is cast on the surface of silicon wafer 402.

Figure 4E:
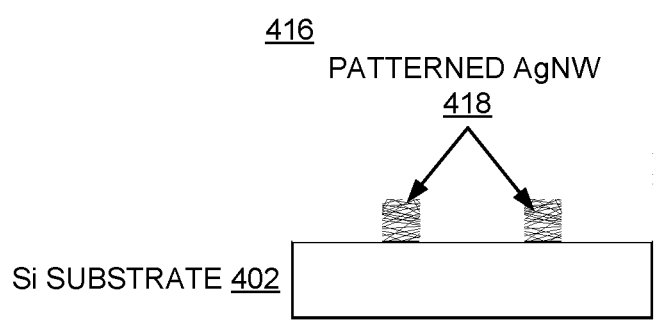

Referring to FIG. 4E, as shown at 416, the parylene film 404 is peeled off and the patterned AgNW 418 is left on the surface of silicon wafer 402.

Figure 4F:
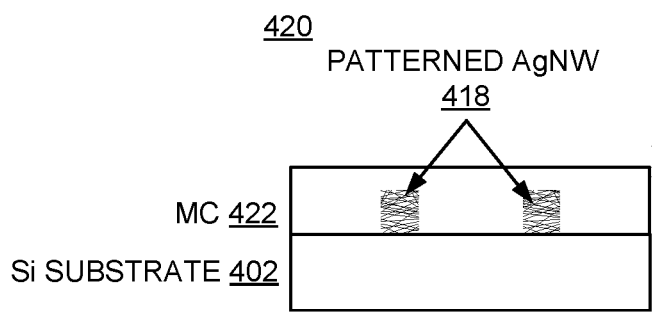

Referring to FIG. 4F, as shown at 420, spin coating a soluble material 422, such as methyl cellulose solution is provided on the patterned AgNW 418 and surface of the wafer 402.

Figure 4G:
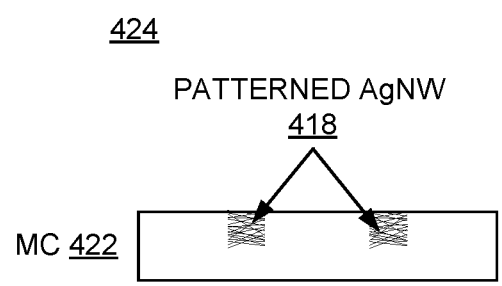

Referring to FIG. 4G, as shown at 424, the soluble material 422, such as methyl cellulose film 422 is peeled from the silicon substrate 402 to form conductive AgNW traces 418 embedded in the soluble material 422, such as the methyl cellulose film.

Figure 5:
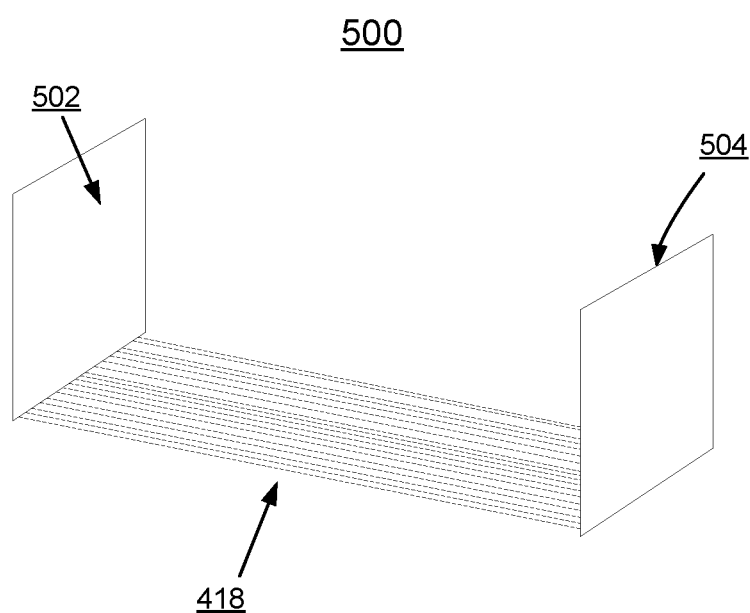
FIG. 5 illustrates an example silver nanowires (AgNW) layer with electrodes for use for a transient electronic circuit for security applications in accordance with a preferred embodiment.

Referring to FIG. 5, there is shown an example transient electronic circuit generally designated by reference character 500 including silver nanowires (AgNW) 418 connected to a pair of electrodes 502, 504 for use for security applications in accordance with a preferred embodiment. Electrical connections or leads 502, 504 are attached to each end of the silver nanowires (AgNW) 418 to be used for electrical open measurements.

It should be understood that other embodiments of AgNW layer structures can be implemented in accordance with features of the invention. For example, in another embodiment of this invention could completely surround or encapsulate the printed circuit board or card being secured rather than only providing the security features on top of the PCB or card.

It should be understood that various techniques and processes can be used to prepare the AgNW layer structures of the invention, and various security protection functions or algorithms can be used with a transient electronic circuit for protection applications in accordance with the invention.

Figure 6:
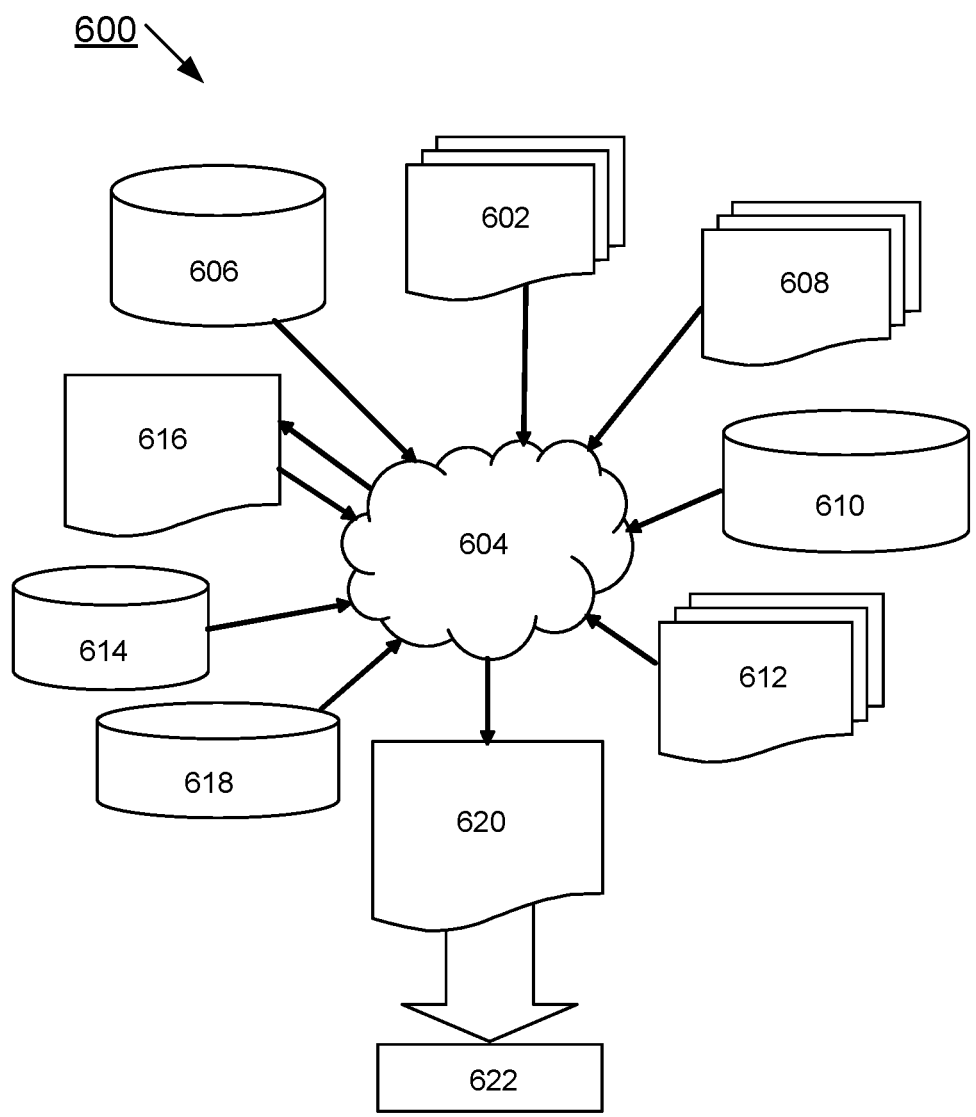
FIG. 6 is a flow diagram of a design process used in semiconductor design, manufacturing, and/or test.

FIG. 6 is a flow diagram of a design process used in semiconductor design, manufacturing, and/or test. FIG. 6 shows a block diagram of an example design flow 600. Design flow 600 may vary depending on the type of IC being designed. For example, a design flow 600 for building an application specific IC (ASIC) may differ from a design flow 600 for designing a standard component. Design structure 602 is preferably an input to a design process 604 and may come from an IP provider, a core developer, or other design company or may be generated by the operator of the design flow, or from other sources. Design structure 602 comprises circuit 300 in the form of schematics or HDL, a hardwaredescription language, for example, Verilog, VHDL, C, and the like. Design structure 602 may be contained on one or more machine readable medium. For example, design structure 602 may be a text file or a graphical representation of circuits 300, 500. Design process 604 preferably synthesizes, or translates, circuits 300, 500 into a netlist 606, where netlist 606 is, for example, a list of wires, transistors, logic gates, control circuits, I/O, models, etc. that describes the connections to other elements and circuits in an integrated circuit design and recorded on at least one of machine readable medium. This may be an iterative process in which netlist 606 is resynthesized one or more times depending on design specifications and parameters for the circuit.

Design process 604 may include using a variety of inputs; for example, inputs from library elements 604 which may house a set of commonly used elements, circuits, and devices, including models, layouts, and symbolic representations, for a given manufacturing technology, such as different technology nodes, 42 nm, 45 nm, 90 nm, and the like, design specifications 610, characterization data 612, verification data 616, design rules 616, and test data files 618, which may include test patterns and other testing information. Design process 604 may further include, for example, standard circuit design processes such as timing analysis, verification, design rule checking, place and route operations, and the like. One of ordinary skill in the art of integrated circuit design can appreciate the extent of possible electronic design automation tools and applications used in design process 604 without deviating from the scope and spirit of the invention. The design structure of the invention is not limited to any specific design flow.

Design process 604 preferably translates embodiments of the invention as shown in FIGS. 1, 2, 3, 4A, 4B, 4C, 4D, 4E, 4F, 4G, and 5, along with any additional integrated circuit design or data (if applicable), into a second design structure 620. Design structure 620 resides on a storage medium in a data format used for the exchange of layout data of integrated circuits, for example, information stored in a GDSII (GDS2), GL1, OASIS, or any other suitable format for storing such design structures. Design structure 620 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, 2, 3, 4A, 4B, 4C, 4D, 4E, 4F, 4G, and 5. Design structure 620 may then proceed to a stage 622 where, for example, design structure 620 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A circuit for implementing enhanced tampering detection for security applications comprising:
   silver nanowire traces fabricated in a soluble material forming a silver nanowire layer of a protection circuit; said silver nanowire layer carried by a security surface for one of the security applications;
   electrical connections attached to the silver nanowire layer used for electrical open measurements;
   a frangible material separating the soluble material from at least one solvent layer proximately located to said silver nanowire layer; said frangible material defining a frangible layer containing said at least one solvent layer;
   said frangible material layer being ruptured responsive to an applied force by attempts at physical access to the protection circuit, releasing the solvent material of said at least one solvent layer, which contacts and dissolves the soluble material and disperses the silver nanowire traces creating an electrical open in said silver nanowire layer of the protection circuit, said electrical open between said electrical connections provided to the protection circuit enabling enhanced tampering detection.

2. The circuit as recited in claim 1 includes said electrical connections connected at opposite ends of said silver nanowire traces and used for detecting the electrical open in said silver nanowire layer.

3. The circuit as recited in claim 1 wherein said frangible material is broken by attempts at said physical access having an applied force sufficient to break said frangible material.

4. The circuit as recited in claim 1 wherein said soluble material is implemented with a non-conductive soluble polymer.

5. The circuit as recited in claim 1 wherein said soluble material includes a non-conductive water soluble material.

6. The circuit as recited in claim 1 wherein said soluble material includes a non-conductive water soluble polymer.

7. The circuit as recited in claim 1 wherein said silver nanowire (AgNW) traces are dissolved together with dissolving the soluble material, providing enhanced tamper detection.

* * * * *